(12) United States Patent
Kapoor et al.

(10) Patent No.: US 8,282,983 B1
(45) Date of Patent: Oct. 9, 2012

(54) CLOSED LOOP CONTROL SYSTEM FOR RF POWER BALANCING OF THE STATIONS IN A MULTI-STATION PROCESSING TOOL WITH SHARED RF SOURCE

(75) Inventors: Sunil Kapoor, Vancouver, WA (US); Edward Augustyniak, Tualatin, OR (US)

(73) Assignee: Novellus Systems, Inc., San Jose, CA (US)

( * ) Notice: Subject to any disclaimer, the term of this patent is extended or adjusted under 35 U.S.C. 154(b) by 1044 days.

(21) Appl. No.: 12/241,758

(22) Filed: Sep. 30, 2008

(51) Int. Cl.
*C23C 16/52* (2006.01)

(52) U.S. Cl. ............ 427/8; 427/569; 118/712; 118/719; 118/723 E; 118/723 I

(58) Field of Classification Search ............... 118/723 E, 118/723 I, 719, 712; 427/569, 8
See application file for complete search history.

(56) References Cited

U.S. PATENT DOCUMENTS

| | | | |
|---|---|---|---|
| 4,545,328 A * | 10/1985 | Fujiyama et al. ......... | 118/723 E |
| 6,143,082 A | 11/2000 | McInerney et al. | |
| 6,199,506 B1 * | 3/2001 | Hilliker et al. ............ | 118/723 E |
| 7,042,311 B1 * | 5/2006 | Hilliker et al. ................. | 333/133 |
| 2003/0056901 A1 * | 3/2003 | Nakano et al. ........... | 156/345.47 |
| 2007/0034479 A1 * | 2/2007 | Todaka ....................... | 198/463.1 |
| 2008/0237187 A1 * | 10/2008 | Dhindsa et al. ................. | 216/71 |

OTHER PUBLICATIONS

U.S. Appl. No. 11/688,695, "Multi-station sequential curing of dielectric films", Shrinivasan et al., filed Mar. 20, 2007.

* cited by examiner

*Primary Examiner* — Timothy Meeks
*Assistant Examiner* — Elizabeth Burkhart
(74) *Attorney, Agent, or Firm* — Weaver Austin Villeneuve & Sampson LLP

(57) ABSTRACT

Apparatus and methods to minimize wafer-to-wafer process variation in RF-based semiconductor processing reactors with shared RF source for multiple processing areas. RF sensors associated with each processing area sends signal to the RF balance controller. The controller modifies station impedance using power adjustment mechanisms. As a result, station to station distribution of a selected RF parameter (e.g., load power) may match the station set points. Closed loop control maintains balance despite changing conditions.

12 Claims, 4 Drawing Sheets

CLOSED LOOP CONTROL SYSTEM FOR RF POWER BALANCING OF THE STATIONS IN A MULTI-STATION PROCESSING TOOL WITH SHARED RF SOURCE

FIELD OF THE INVENTION

This invention relates to electronic device fabrication processes and associated apparatus. More specifically, the invention relates to improved control over RF (radio frequency) power for processing stations sharing an RF source.

BACKGROUND OF THE INVENTION

Semiconductor device fabrication involves the processing of semiconductor wafers in a semiconductor processing reactor. Typical processes involve deposition and removal (i.e., etching) of material on the wafer. In commercial scale manufacturing, each wafer contains many copies of a particular semiconductor device being manufactured, and many wafers are required to achieve the required volumes of devices. The commercial viability of a semiconductor processing operation depends in large part upon within-wafer uniformity and wafer-to-wafer repeatability of the process conditions. Accordingly, efforts are made to ensure that each portion of a given wafer and each wafer processed are exposed to the same processing conditions. Variation in the processing conditions usually causes variation in deposition and etch rates resulting in unacceptable variation in the overall process and product.

Techniques and apparatus to minimize process variation are required.

SUMMARY OF THE INVENTION

The present invention provides apparatus and methods to minimize process variation in RF-based semiconductor processes across multiple processing stations sharing an RF power source. Multiple processing stations may use a single RF power source and use a distribution system to deliver approximately equal power to each station. Approximate power balance is achieved by symmetric design and high impedance of delivery circuit; however, small variations in various characteristics can still result in different levels of power delivered to each station. RF power split among the stations may be specified to be substantially equal, as required by wafer-to-wafer repeatability specifications, or a specified ratio, as required to deposit layers of material with different properties.

The present invention pertains to a method and apparatus to balance or to fine-tune dynamic impedances at each station during plasma operation. A method of plasma-assisted semiconductor deposition process in multiple stations sharing an RF power source includes providing a substrate at each station, generating a total RF power, distributing the total RF power to the stations, adjusting a station RF power, and depositing a thin film on the substrate at each station. This method may also include measuring an RF parameter at each station, comparing the RF parameter at each station with a set point for each station, and determining an adjustment to the station RF power. The RF power parameter may be related to power, e.g., voltage, current, phase, or impedance. The set point for each station may be specified for the RF power parameter or be specified relative to each station or a total. For example, a four station set point may be 20%, 20%, 30%, and 30%.

The method may also include adjusting the RF power conditions at stations where an adjustment is required. The adjustment may be required if the RF power parameter is outside a certain range or if the difference between stations is outside a certain range. The adjusting may include changing capacitances on one or more capacitors associated with a particular station or varying an inductance on an inductor associated with a particular station. The one or more capacitors may be variable capacitors or a bank of capacitors of different capacitances so that activating one or more of them changes the total capacitance.

The operations of measuring, comparing, determining and adjusting may be repeated during the deposition operation. In certain embodiments, the measuring operation occurs before the substrate is provided. The measured parameter may be impedance, voltage, current, power, or a combination of these. The measurement may be accomplished with a voltage sensor, a voltage and current sensor, or a power sensor. The sensor may be installed in-line at each station at a powered electrode.

The resulting RF power at each station may be substantially the same to obtain a high wafer-to-wafer repeatability. These multiple stations may be in one reactor or different reactors.

In another aspect, the present invention pertains to a semiconductor plasma processing tool. The tool includes a plurality of processing stations, an RF power source, an RF distribution system connected to the RF power source and to each processing station, an RF adjuster associated with each processing station, and an electrical sensor connected to each processing station. The tool may also include an impedance matching system associated with the RF power source and a controller to control the RF adjuster at each station.

The RF adjuster may be a variable capacitor, or a number of capacitors of different capacitances, or a variable coil inductor, or a number of inductors of different inductances. The variable capacitor or coil inductor may include a stepper motor or other means to adjust station impedance. The sensor may be a voltage and current probe.

In certain embodiments, the method of the present invention pertains to a closed-loop RF power control method. The method includes generating a total RF power; distributing RF power for each station in the multi-station chamber; measuring the selected RF power parameter at each station; comparing the RF power parameter at each station with a set point; determining an adjustment to an RF characteristic at each station;

and, adjusting the RF characteristic, e.g., impedance. The set point is a set of RF parameter values, absolute or relative to the average value, that determine a selected RF characteristic for each station. The method may also include repeating the measuring, comparing, determining, and adjusting operations until the difference between the measurement and set point is within a specified acceptance range.

These and other aspects and advantages of the invention are described further below and with reference to the drawings.

DETAILED DESCRIPTION OF THE PRESENT INVENTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances, well-known processes, procedures and components have not been described in detail so as not to unnecessarily obscure aspects of the present invention.

Apparatus

Figure 1:
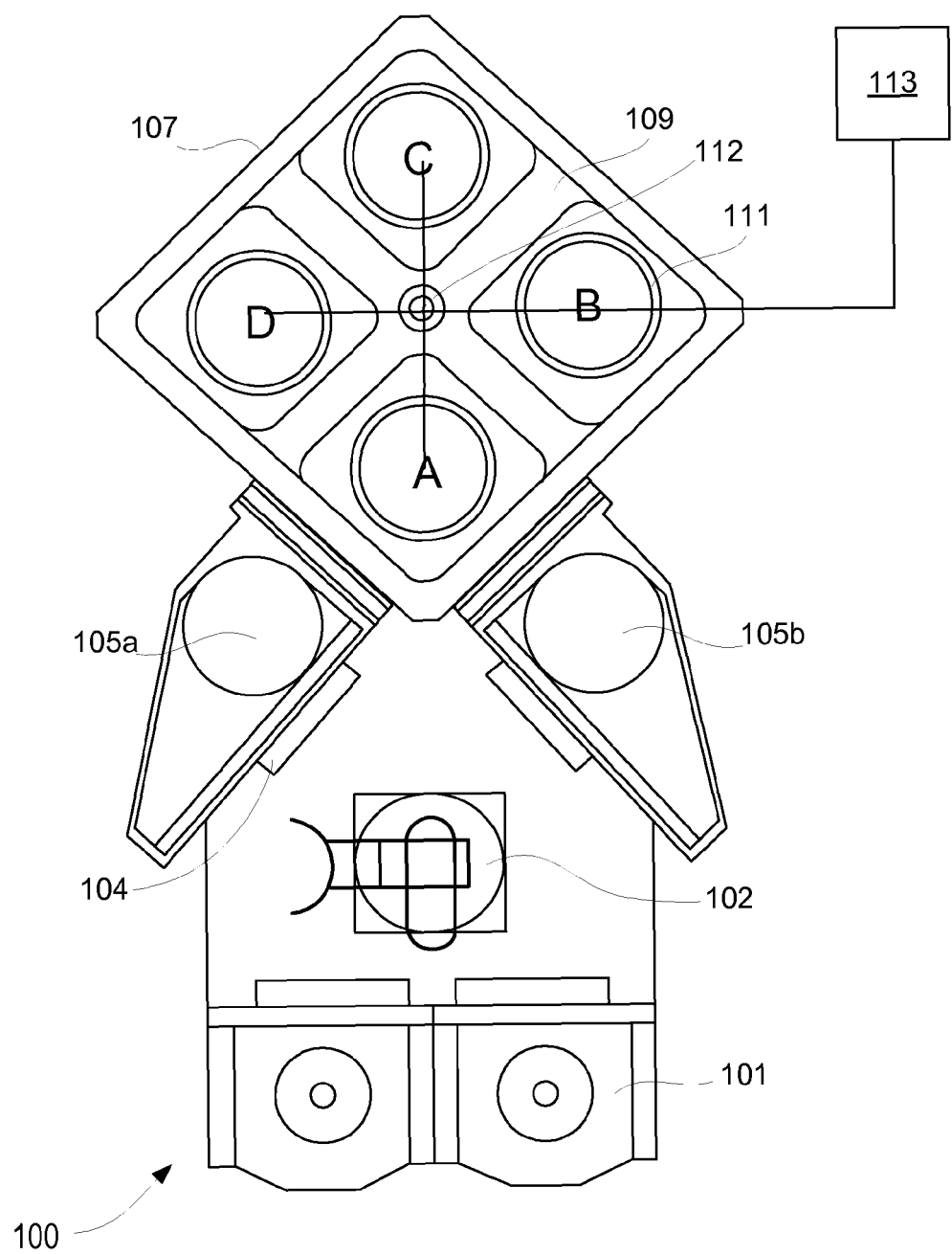
FIG. 1 is a diagram showing a semiconductor processing tool in accordance with various embodiments of the present invention.

As indicated, the present invention provides apparatus and methods to control RF power at individual stations that share an RF power source. Multiple processing stations on a reactor chamber may share an RF power source. FIG. 1 shows a schematic of one example of a multi-station processing reactor tool, in this case a four-station reactor, such as a Vector™ reactor from Novellus Systems, Inc. that employs a shared RF power source.

The tool 100 generally operates as follows: A wafer enters the tool 100 from a cassette loaded through a pod 101, such as the front opening unified pod (FOUP) used in 300 mm wafer systems. A robot 102, at atmospheric pressure, moves the wafer from the cassette to one of two load locks 105a or 105b. For example, the wafer enters the loadlock 105a through an atmospheric port 104 and is placed on a loadlock pedestal. The atmospheric port 104 to the atmospheric environment then closes, and the loadlock 105a is pumped down to an appropriate pressure for transfer into the reactor 107. Then a transfer port to a reactor 107 opens, and another robot places the wafer into the reactor on a pedestal of a first station in the reactor. The above example used load lock 105a for ingress of the wafer, but load lock 105b may be used also.

The reactor 107 in the depicted wafer processing tool has four stations, identified as A to D. Each station is capable of performing a semiconductor processing operation, such as a material deposition (addition) or etch (removal), sequentially or simultaneously with the other stations. At least some, and often all of the stations perform RF-based semiconductor processing operations. The wafer is moved from one station to the next using a wafer indexing mechanism 109, which may include ceramic carrier rings 111 and a spindle 112.

The RF power is generated at an RF power system 113 and distributed to each of the stations A to D. The RF power system may include one or more RF power sources, e.g., a high frequency (HFRF) and a low frequency (LFRF) source, impedance matching modules, and filters. The distribution system of the RF power system is symmetric about the reactor and has high impedance. This symmetry and impedance result in approximate equal amounts of power being delivered to each station. Small differences in RF power, in the order of 5 to 15%, may arise from tolerances in distribution system components, station alignments, temperature differences, and surface conditions.

During sequential processing, each wafer experiences processing at each station in turn, so that every wafer experiences the same environment. Variations in station to station RF power do not cause wafer-to-wafer variations as long as station RF power does not vary over time. However, during parallel or mixed parallel and sequential processing, different wafers are processed in a different subset of stations. In a mixed parallel and sequential processing example, deposition may be performed on wafer X in stations A and B while deposition is performed on wafer Y in stations C and D. Wafers X and Y may be removed from the reactor after these depositions.

At 45 nm and 32 nm technology nodes, when very thin films are used, parallel processing and mixed parallel and sequential processing are better suited to optimize throughput and film quality requirements. Small differences in RF power can cause wafer-to-wafer non-uniformity in a variety of film characteristics, e.g., composition, thickness, density, amount of cross-linking, chemistry, reaction completion, stress, refractive index, dielectric constant, hardness, etch selectivity, stability, hermeticity, etc. Thus, the ability to fine-tune plasma power at individual stations and to dynamically respond to changing station conditions becomes more important. Note that the present invention is not limited to a multi-station reactor; the method and apparatus disclosed herein applies to other RF power systems where multiple processing areas share an RF power source.

Figure 2:
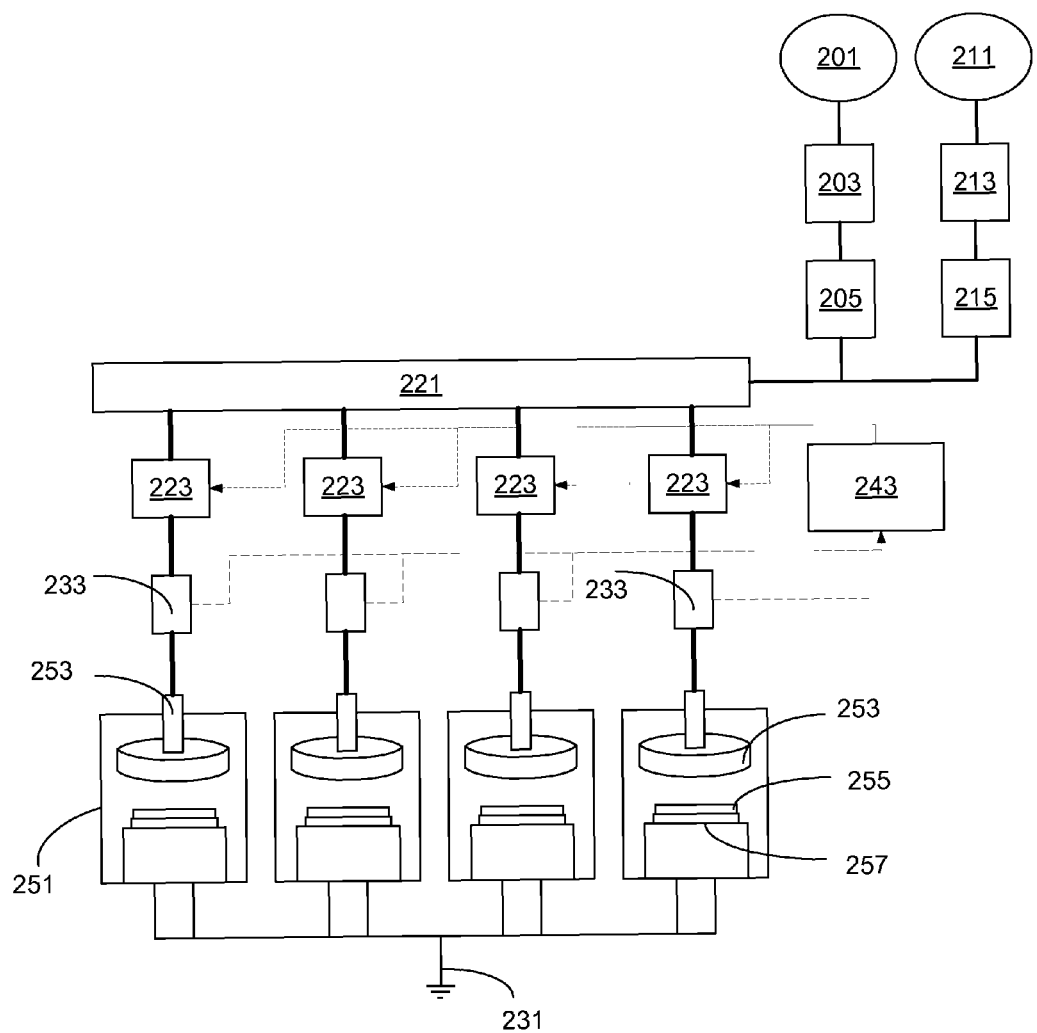
FIG. 2 is a schematic diagram showing various components in the RF power circuit for multiple stations sharing a RF power source in accordance with the present invention.

According to various embodiments, FIG. 2 provides a simple schematic diagram depicting various components in the RF power circuit for multiple stations sharing a RF power source. As shown, RF power from high frequency RF (HFRF) source 201 and low frequency RF (LFRF) 211 are distributed via a distribution network 221 to multiple stations 251. The HFRF may have a frequency of about 2-60 MHz, or about 13.56 MHz. The LFRF may have a frequency of about 100 kHz to about 1 MHz, or about 400 kHz. The HFRF source 201 power may be routed through an impedance matching system that may include an auto match module 203 and a high pass (HP) filter 205. The optional LFRF source 211 power may be routed through a fixed match 213 and then a low pass (LP) filter 215.

From the distribution network 221, the RF power is connected to a RF adjuster 223, then to an RF power parameter sensor 233 before the showerhead 253. The 2 schematic diagram of FIG. 2 depicts an example of a possible RF network. The current invention applies to other systems with RF connected to the bottom electrodes or to the both electrodes.

The RF adjuster 223 is controlled by RF controller 243. RF controller 243 may change the RF power at individual stations by a determined amount based on the measurement from the sensors 233 at each station 251. In certain embodiments, the RF adjusters 233 may be variable capacitors. The RF controller 243 may control a stepper motor (not shown) that can vary the capacitance of a variable capacitor. Other ways to vary a capacitance may be used. For example, the RF adjusters 223 may also be a bank of capacitors with individual switches. The RF power may be controlled by activating (turning on) a number of capacitors having a specified value. For example, capacitors may be selected to add 1 pF, 2 pF, 4 pF, 8 pF, and 16 pF shunt capacitance to the station. In this example, all combinations of active (turned on) and non-active (turned off) capacitors cover the range from 0 pF to 31 pF with 1 pF resolution. By selecting which capacitors to activate, the controller can change the RF power to a station. This digital control can be faster than using a stepper motor to control a variable capacitor, especially when a wide range of capacitance needs to be covered. Depending on the space available and the amount of control required, one skilled in the art would be able to design a RF adjuster using one or more capacitors to change RF power by a certain amount.

In other embodiments, the RF adjusters 233 may be variable coil inductors. The RF controller 243 may control the variable coil inductors to affect RF power delivered to the station. The RF adjusters of the present invention are not limited to capacitor and inductors. One skilled in the art may be able to design other RF adjusters 233 that utilize different mechanisms to change the RF power, such as resonator circuits or resistive circuits.

The sensors 233 measure at least one RF power parameter, preferably close to where the RF power enters the station 251 at the showerhead 253. The RF power parameter may be voltage, current, impedance, phase, or load power. Commercially available probes may be used to measure the RF power parameter and provide the measurement to the RF controller 243. It is also possible to measure a non-RF parameter and use it as source signal for the RF controller 243. For example, optical emission from station plasma or substrate temperature sensors can measure station characteristics and feed them to the adjuster controller 243. An optical emission system may be installed in the vicinity of each station to collect light emitted by station plasma. A substrate temperature sensor may use remote infrared detection system built under a substrate.

Each station 251 contains a showerhead 253 working in conjunction with a grounded pedestal 257. The power and frequency supplied is sufficient to generate a plasma from the process gas, for example within the range of about 50-500 W per station. Often, though not always, both the high frequency (HF) generator and low frequency (LF) generator are used. Within the station, a wafer pedestal 257 supports a substrate (wafer) 255. The process gases are introduced. Appropriate valving and mass flow control mechanisms are employed to ensure that the correct gases are delivered during the deposition and plasma treatment phases of the process.

The RF excitation is connected to the station processing area via the showerhead 253 and generates or sustains a plasma. The plasma causes material to be deposited onto the substrate by a variety of mechanisms. For example, the plasma can cause process gas to break down and react on the substrate surface. The RF current couples to the pedestals 257 that are grounded at 231.

Although four processing stations are shown, the system may include two or more stations. Thus, three, four, five, or more stations may be used. These stations may be located in the same reactor or different reactors (chambers).

Referring back to FIG. 1, at the end of processing at each station, the wafer is indexed to the next station for further processing. At the end of sequential processing, the wafer is returned to station A. The wafer then leaves the reactor through a transfer port to a loadlock 105a or 105b, where the wafer may be cooled on the cooling pedestal before finally returning to the cassette in the pod 101. Thus under sequential processing, each wafer, in turn, is processed at every station. In a mixed parallel and sequential processing, two wafers may experience sequential processing in two stations, for example, stations A and B for wafer X and stations C and D for wafer Y at the same time.

Note that the individual station RF power control allows the RF power not only to be balanced at each station, but also to be made intentionally different. For example, referring to the station from FIG. 1, stations A and C may use 20% each of total available RF power while stations B and D use 30% each of RF power. The uneven power split may be needed to satisfy some specific process requirement or to compensate existing asymmetry in the system.

Process

Figure 3:
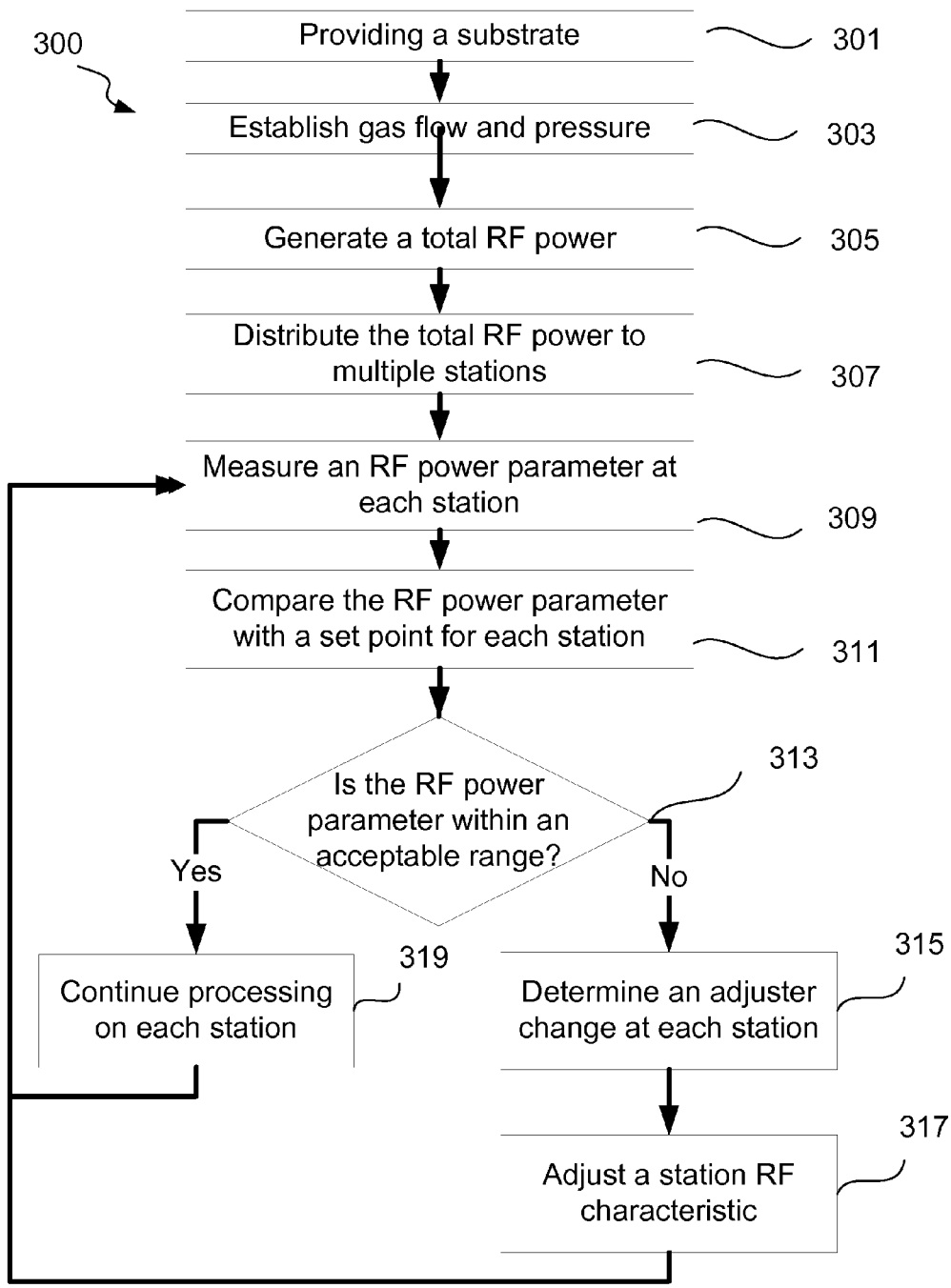
FIG. 3 is a process flow diagram of a deposition procedure in accordance with the present invention.

FIG. 3 is a process flow diagram of a deposition procedure that includes a closed-loop control of station RF power. Note that although the process and closed-loop control are discussed in the context of a deposition procedure, the elements may be applied to any plasma-assisted semiconductor process, e.g., etching or ashing.

In operation 301, a substrate is provided. Substrates may be provided to one or more stations of a multi-station tool. The number of stations and substrates depends on the total number of stations and whether the processing is sequential, parallel, or a mix of sequential and parallel. During sequential processing, substrates may be provided from the previous station. For example, the substrate provided to station C may have experienced processing at station B. During parallel processing, substrates may be provided from a substrate cache or pod. In that case, the substrate provided to station C may have pass through station B, but not experienced processing at station B.

Operation 301 may be omitted in some circumstances. Station RF power may be calibrated without a substrate in a station, for example, after a maintenance event that affects components in the RF power circuit. However, the absence of a substrate may affect the RF power parameter measurement.

In the next operation (303), gas flow is established and pressure is stabilized at the set point. Operation 305 starts RF power and the processing cycle (e.g., deposition, etch, ashing). This total RF power may be HFRF, LFRF or both HFRF and LFRF. RF excitation may be conditioned by an impedance matching system before it is distributed to multiple stations that share the total RF power source in operation 307. Details regarding the impedance matching system are known in the art and are not elaborated on here. The distribution system is designed to distribute the total RF power substantially equally to each station in the circuit. This is accomplished by symmetry and high impedance of the system. However, the dynamic impedances in the stations may still vary. As discussed above, small variations in station RF power occur due to various component characteristics, some of them changing over time in different ways. Examples of these characteristics include tolerances in distribution system components, station alignments (e.g., distance between showerhead and pedestal/substrate surface), and surface conditions including the wafer surface, showerhead surface, and other chamber component surfaces.

An RF power parameter at each station is measured at operation 309 to determine these variations among the stations. The RF power parameter is measured after plasma is generated in the station and reflects the dynamic impedances in each station. This parameter may be a voltage, current, impedance, phase, load power or any combination of them.

The RF power parameter measurements are compared with a set point for each station in operation 311. For RF power balancing, the set points are the same. In other scenarios, the set points may be different at each station. This comparison may be performed at a local controller, a central controller for RF adjusters, or at a system control for the entire tool.

The total RF power delivered to the all stations that share a common RF source depends on the power set point at the RF generator, the impedance of the plasma load and the impedance of RF network. The RF adjusters affect primarily station-to-station power distribution. Adjuster effects on total power are usually secondary. In certain cases, depending on the type of RF adjuster used, a reduction in RF power of one station may increase RF power in other stations. In those cases the controller may determine an adjustment taking station-station RF power interactions into account or simply repeat the adjustment many times until the measurements are close enough to the set point.

In certain cases an absolute RF power level is desired. In this case, RF power can be measured at each station and then two adjustments executed. For example, first, total power at the generator output is changed to match the sum of station set points. Second, the station RF adjusters are tuned to split power according to the set points. The order of adjustments (total power vs. split) may be reversed. The procedure is repeated until power split is close enough to the set points.

In operation 311, the measured RF power parameter distribution is compared with the set points. If the difference is higher than a threshold, then an adjuster change at each station is determined at operation 315. This adjuster change may be determined by the RF controller or another controller. Note that the parameter or RF characteristic to be adjusted may be different from the RF power parameter measured. In one example, RF power may be measured and capacitance or impedance adjusted.

The adjuster change is then applied to adjust a station RF characteristic at operation 317. In certain embodiments, the station impedance is adjusted by the adjuster change amount in operation 317. The station RF power parameter is then measured again in a repeated operation 309 and the adjustment cycles continue until the measured power parameter distribution is within acceptance range of the set points. Once the requested RF power parameter distribution is achieved, the semiconductor processing continues in operation 319. The process may be to deposit a thin film on the substrate at the station, etching, or other plasma-assisted processing. Periodically, the RF power parameter is measured again in operation 309 to check whether the station-to-station distribution is stable. If not, adjustment is repeated.

According to the various embodiments, the measuring operation (309) may occur one deposition process earlier. In other words, the RF power adjustment for deposition "N" may be based on the measurement from deposition "N−1." This method also has the benefit of performing impedance adjustments between deposition cycles without a substrate in the station. Avoiding exposure of substrates to changing RF conditions reduces the risk of damaging the substrate with partially fabricated chips.

Figure 4A:
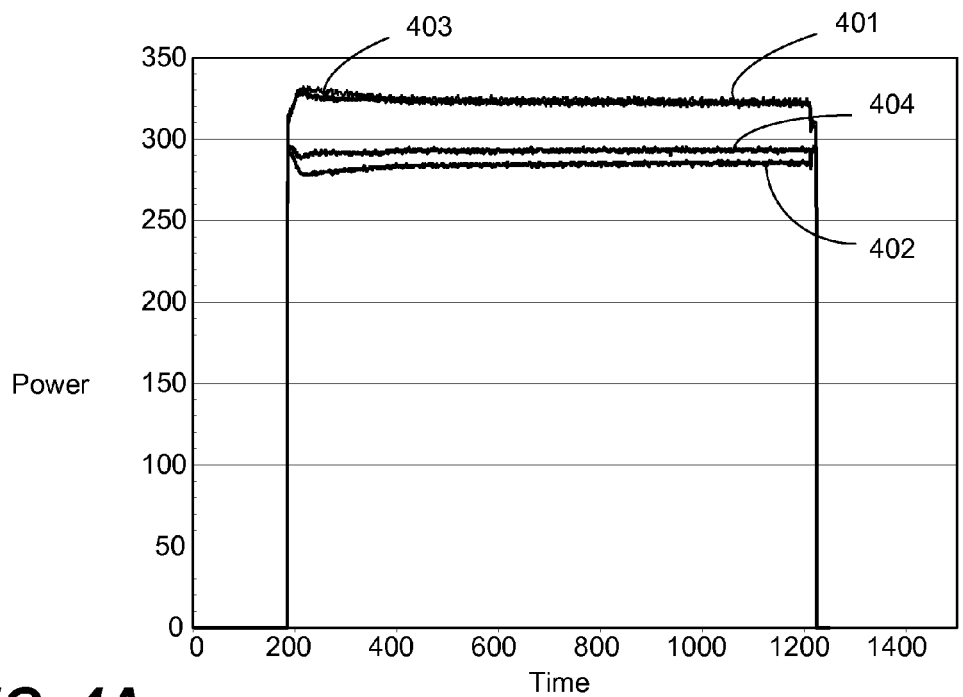
FIGS. 4A and 4B are plots of RF power before and after performing a power balancing procedure in accordance with the present invention.

In the power balancing context, continuous RF power control during processing may be needed for at least two reasons. One possibility is following an intentional RF power curve. The set points may vary over time during a processing sequence. The RF adjusters may be used to maintain specific power distribution as set points vary. In another possibility, the station RF power may have tendency to drift during processing and needs to be adjusted based on dynamic feedback. FIG. 4A shows a plot of measured RF power of four stations connected to the same RF source. For each station, the RF power increases very quickly initially and then flattens out and holds steady over time. It is apparent that station power is not the same and that power evolution varies from station to station. Dynamic adjustment based on continuous feedback provides better power balancing under these conditions.

Example

Figure 4B:
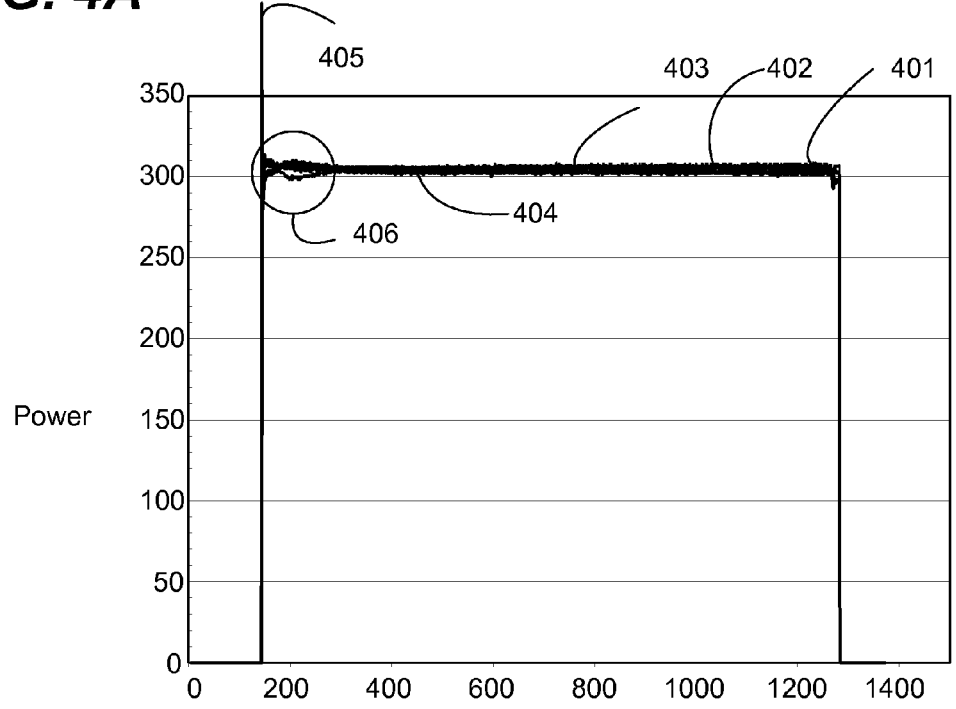

Actual station HF RF power data was collected on a Vector Extreme system, available from Novellus Systems of San Jose, Calif. FIGS. 4A and 4B are plots of the station RF power (Watts) measured over time (arbitrary units). FIG. 4A shows measurement for four stations A (401), B (402), C (403), and D (404) without any RF power balancing. As described above, the RF power changed over time. Stations A and C (as shown by lines 401 and 403) have station RF powers that overlap considerably. Stations B and D (as shown by liens 402 and 404) have station RF powers that differ from that of stations A and C and from each other.

After the station RF power data was collected, capacitors associated with each station were manually tuned to bring all RF powers to the same level. FIG. 4B is a plot of station RF powers collected after the capacitor tuning. For most of the curve, lines 401 to 404, corresponding to stations A to D, are indistinguishable. An initial spike 405 was recorded for station D, which may be attributed to an artifact of the measurement apparatus. Initially, the measurements varied a little around about 310 Watts. Overall the power balance in FIG. 4B is much improved over that of FIG. 4A.

The FIGS. 4A and 4B show that tuning station capacitors can provide good RF power balancing. Note that this data was generated with a manual tuning between processing. The closed-loop control process disclosed above would provide even better power balancing. Continuous dynamic control would reduce the initial differences, shown in region 406 of FIG. 4B, and match RF power at each station during the entire process.

CONCLUSION

Although the present invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein.

What is claimed is:

1. A method of plasma-assisted semiconductor deposition in multiple stations sharing a radio frequency (RF) power source, the method comprising:
   providing a substrate at each of multiple stations, wherein the multiple stations are in one chamber;
   generating a total RF power;
   distributing the total RF power to the multiple stations;
   measuring an RF power parameter at each station;
   comparing the RF power parameter at each station with a set point for each station;
   determining a change to an RF adjuster to adjust the RF characteristic at each station such that the difference between the measurement and set point is reduced;
   adjusting a station RF characteristic; and,
   depositing a thin film on the substrate at each station.

2. The method of claim 1, further comprising repeating the measuring, comparing, determining, and adjusting operations during the depositing operation.

3. The method of claim 1, wherein the measuring operation occurs before or after the substrate is provided.

4. The method of claim 1, wherein the station RF power at each station during the depositing operation is substantially the same.

5. The method of claim 1, wherein the adjusting operation comprises changing capacitances on one or more capacitors associated with a particular station.

6. The method of claim 1, wherein the adjusting operation comprises varying an inductance on an inductor associated with a particular station.

7. The method of claim 1, wherein the measuring operation comprises sensing a voltage and a current associated with each station.

8. The method of claim 1, wherein the measuring operation comprises sensing a voltage.

9. The method of claim 1, wherein the measuring operation is conducted one deposition process earlier than the RF station characteristic adjustment for the deposition.

10. The method of claim 9, wherein the adjustment is conducted between deposition cycles without a substrate in the station.

11. A closed-loop RF power control method for multiple processing stations sharing an RF power source, the method comprising:
   generating a total RF power;
   distributing RF power for each station in a multi-station chamber;
   measuring an RF power parameter at each station;
   comparing the RF power parameter at each station with a set point;
   determining an adjustment to an RF characteristic at each station; and,
   adjusting the RF characteristic to reduce the difference between the measurement and set point.

12. The closed-loop RF power control method of claim 11, the method further comprising:
   repeating the measuring, comparing, determining, and adjusting operations until the difference between the measurement and set point is below a specified threshold.

* * * * *